(12) United States Patent
Dusad et al.

(10) Patent No.: US 10,367,511 B2
(45) Date of Patent: *Jul. 30, 2019

(54) COUNTER-BASED SYSREF IMPLEMENTATION

(71) Applicant: TEXAS INSTRUMENTS INCORPORATED, Dallas, TX (US)

(72) Inventors: Shagun Dusad, Bangalore (IN); Visvesvaraya Pentakota, Bangalore (IN); Mark Baxter Weaver, Dallas, TX (US); William Bright, Allen, TX (US); Jiankun Hu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/036,221

(22) Filed: Jul. 16, 2018

(65) Prior Publication Data

US 2018/0323790 A1 Nov. 8, 2018

Related U.S. Application Data

(63) Continuation of application No. 15/395,489, filed on Dec. 30, 2016, now Pat. No. 10,050,632.

(51) Int. Cl.
*H03K 21/00* (2006.01)
*H03K 23/00* (2006.01)
*H03L 7/08* (2006.01)
*G06F 1/12* (2006.01)
*H03L 7/16* (2006.01)

(52) U.S. Cl.
CPC ................ *H03L 7/08* (2013.01); *G06F 1/12* (2013.01); *H03L 7/16* (2013.01)

(58) Field of Classification Search
CPC ................ H03L 7/08; H03L 7/16; G06F 1/12
See application file for complete search history.

(56) References Cited

U.S. PATENT DOCUMENTS

| 9,354,261 | B2 | 5/2016 | Hsu |
| 10,050,632 | B2 * | 8/2018 | Dusad ...................... H03L 7/08 |
| 2011/0158031 | A1 | 6/2011 | Ware et al. |
| 2013/0002314 | A1 | 1/2013 | Sheafor |
| 2015/0222274 | A1 | 8/2015 | Cenger et al. |
| 2016/0041579 | A1 | 2/2016 | Ali et al. |

OTHER PUBLICATIONS

International Search Report in corresponding PCT Application No. PCT/US2017/068967, dated Apr. 26, 2018 (2 pages).

* cited by examiner

*Primary Examiner* — Kenneth B Wells
(74) *Attorney, Agent, or Firm* — John R. Pessetto; Charles A. Brill; Frank D. Cimino

(57) ABSTRACT

A system (and associated method) includes an input flip-flop, a counter, and a clock tree. The input flip-flop includes a clock input terminal configured to be coupled to a device clock, or a clock generated from a phase-locked loop, and a data input terminal configured to be coupled to a first reference signal. The input flip-flop is configured to use the device clock to latch the reference signal to produce a latched reference signal. The counter is configured to count pulses of the device clock starting upon detection of the latched reference signal and to output a second reference signal comprising a pulse for every L pulses of the device clock. The clock tree is configured to divide down the device clock to generate a first output clock. The clock tree is configured to be synchronized by a pulse of the second reference signal.

3 Claims, 4 Drawing Sheets

COUNTER-BASED SYSREF IMPLEMENTATION

CROSS-REFERENCE TO RELATED APPLICATION(S)

This continuation application claims priority to U.S. patent application Ser. No. 15/395,489, filed Dec. 30, 2016, now U.S. Pat. No. 10,050,632, which is hereby incorporated herein by reference

BACKGROUND

Many chips operate using multiple clocks of different frequencies. Often, a chip may contain cascaded clock dividers. That is, a main clock is divided down to produce a clock at a lower clock frequency, and the clock at the lower frequency is provided to a second clock divider to divide down the clock even further. In this way, multiple clock signals at a variety of frequencies may be created and used internally to the chip.

In some implementations, a low frequency signal known as SYSREF is used to synchronize all generated clocks across of the clock dividers inside the chip. SYSREF is used to ensure that the various clock frequencies are synchronized in terms of their phases. SYSREF may be latched by a flip-flop using an input clock and the latched SYSREF is then used to synchronize the various clock dividers. For systems that include cascaded clock dividers, in which one clock divider provides the clock input to another clock divider, more than one SYSREF pulse may be used to synchronize all of the clock dividers. The latched SYSREF pulse may be periodic with all the different clocks present in the chip. Typically this is achieved by using a SYSREF pulse period which is the lowest common multiple (LCM) of all the different clock periods, or an integer multiple of the LCM. To keep the SYSREF pulses periodic with respect to all the clocks, the SYSREF pulse needs to be latched with respect to the input clock with sufficient setup and hold margin. Once SYSREF is latched properly at the first flip-flop, it is much simpler to keep the latched SYSREF periodic inside the chip with respect to all the other clocks as the delay between SYSREF and all other clocks can be matched. As the device input clock frequency is set at higher and higher frequencies, it may become difficult to guarantee proper setup and hold margins across variations in process, voltage, and temperature (PVT) at the flip-flop that latches SYSREF. Further, if, for some reason, the SYSREF and device clock input to the chip are asynchronous, the periodicity of the latched SYSREF pulse cannot be guaranteed with respect to device clock.

SUMMARY

In an embodiment, a system includes an input flip-flop, a counter, a first level clock divider, and a second level clock divider. The input flip-flop includes a clock input terminal configured to be coupled to a device clock and a data input terminal configured to be coupled to a first reference signal. The input flip-flop is configured to use the device clock to latch the reference signal to produce a latched reference signal. The counter is coupled to the input flip-flop and is configured to count pulses of the device clock starting upon detection of the latched reference signal and to output a second reference signal comprising a pulse for every L pulses of the device clock. The first level clock divider is coupled to the device clock and is configured to divide down the device clock to generate a first divided clock. The second level clock divider is coupled to the first level clock divider and is configured to divide down the first divided clock to generate a second divided clock. Each of the first and second level clock dividers includes a reference signal input configured to receive the second reference signal pulses from the counter. The second reference signal pulses synchronize the first and second level clock dividers.

In yet another embodiment, a system includes an input flip-flop, a counter, and a clock tree. The input flip-flop includes a clock input terminal configured to be coupled to a device clock and a data input terminal configured to be coupled to a first reference signal. The input flip-flop is configured to use the device clock to latch the reference signal to produce a latched reference signal. The counter is configured to count pulses of the device clock starting upon detection of the latched reference signal and to output a second reference signal comprising a pulse for every L pulses of the device clock. The clock tree is configured to divide down the device clock to generate a first output clock. The clock tree is configured to be synchronized by a pulse of the second reference signal.

In another embodiment, a method comprises latching a pulse of a reference signal. The method further includes using the latched pulse to trigger a counter to count pulse of a device clock and outputting a pulse from the counter every L number of pulses of the device clock. The method also includes dividing down the device clock by a clock divider and synchronizing the clock divider using a pulse from the counter's output pulses.

BRIEF DESCRIPTION OF THE DRAWINGS

For a detailed description of various examples, reference will now be made to the accompanying drawings in which.

DETAILED DESCRIPTION

Figure 1:
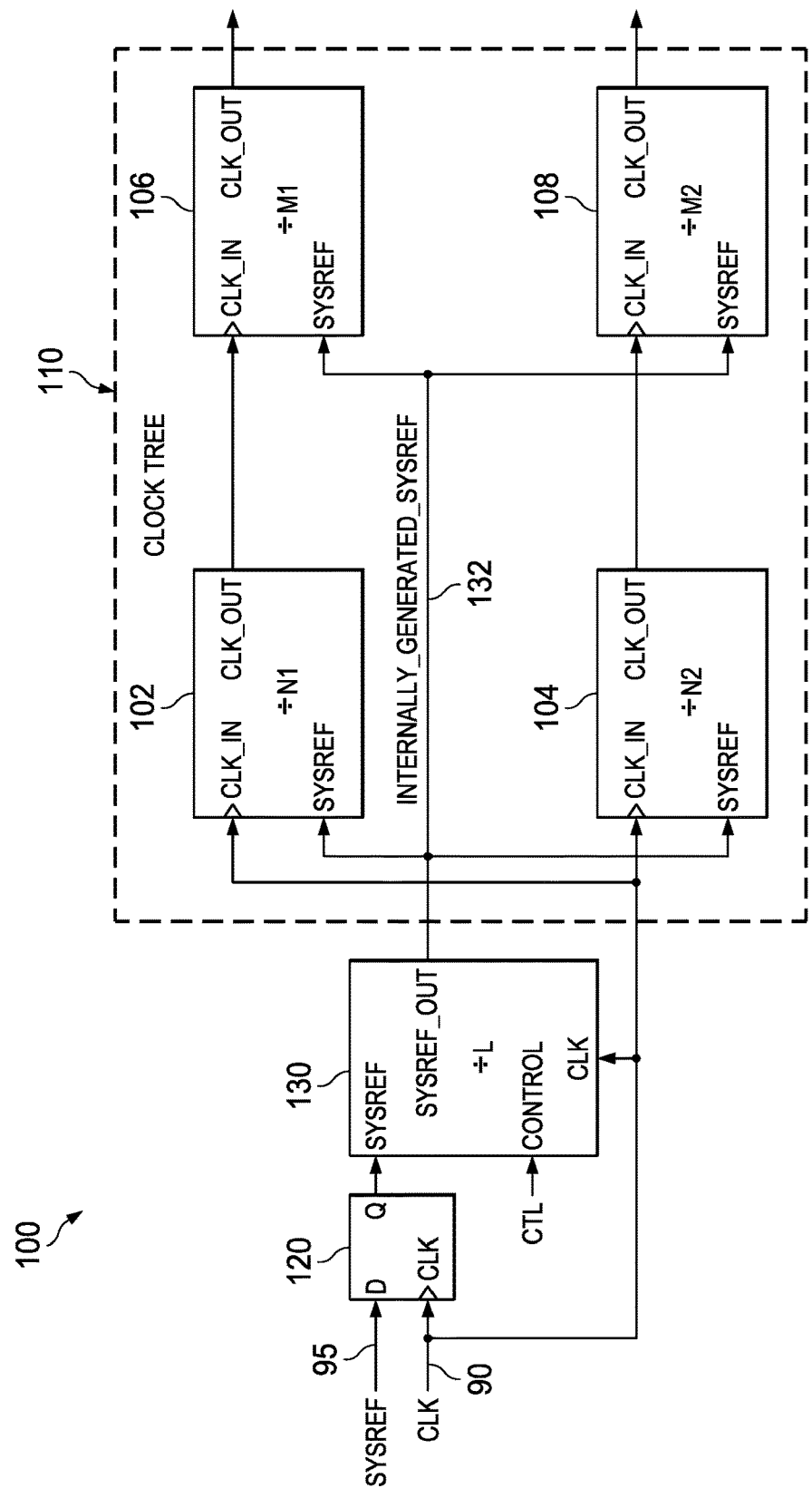
FIG. 1 shows a system in accordance with various examples.

In the embodiments described herein, an electronic device includes multiple electronic components formed, for example, on a chip that uses a clock to control the components' timing. In some implementations, the electronic device may comprise an analog-to-digital converter (ADC) which converts an incoming analog signal to a digital value. The electronic device, however, may perform any of a variety of other functions. In some embodiments, a device clock and a system reference (SYSREF) signal may be provided to the chip. The device clock is at a preconfigured frequency and may be used by one or more of the electronic components of the device. The SYSREF signal may be implemented in accordance with, for example, the JESD204B serialized interface for high-speed ADCs and high-speed digital-to-analog converters (DACs) specification. The SYSREF signal may be sampled based on the device clock and used to align the boundary of, for example, the local multi-frame clock inside a data converter and also may be used to reset various logic blocks such as a clock divider. Some electronic devices may need SYSREF to put the device into a known, correct state even before configurations can be loaded into the device.

In accordance with the disclosed embodiments, an electronic device includes a clock tree that comprises a cascaded arrangement of clock dividers. The cascaded arrangement of dividers may include a first level clock divider that divides down an input device clock (e.g., an externally provided clock) to produce a first divided down clock. The first divided down clock is at a lower frequency than the input device clock and is provided to a second level clock divider that divides down the first divided down clock to produce a second divided down clock, which has a frequency lower than the frequency of the first divided down clock. The input to the clock tree may include a counter that counts pulses of the device clock and is initiated to count using a pulse of the externally provided SYSREF signal. The counter counts a predetermined number of device clock pulses upon detection of an edge of the SYSREF signal. Once the counter reaches the predetermined number of device clock pulses, the counter outputs a counter output pulse. The counter's output pulse is provided to the SYSREF inputs of the various clock dividers in the clock tree, instead of the externally supply SYSREF signal.

By using the externally supplied SYSREF signal to trigger the input counter to count and using the counter's output pulses as an internal SYSREF signal for the various clock dividers, any one or more of the clock dividers can be powered down when not needed, and when again powered up are resynchronized by the internally generated periodic SYSREF signal from the counter in the same phase as was the case before being powered down. Thus, once the counter begins counting, advantageously no more external SYSREF pulses are needed. In some embodiments, the output of the counter may be gated and thus can be gated off thereby precluding the counter's output pulses from being transmitted through the device to the various clock dividers. By gating off the counter's output after synchronizing the clock dividers, coupling of the counter output to other signals and clocks within the device is reduced or eliminated. It is possible that the setup and hold time is not met for the flip-flop that receives the externally generated SYSREF pulse. However, once the counter begins counting, the internally generated SYSREF signal will be periodic and will synchronize all of the clock dividers.

FIG. 1 shows an embodiment of an electronic device 100 including a clock tree 110. The clock tree 110 in this example includes two first level clock dividers 102 and 104 and two second level clock dividers 106 and 108. Additional levels of clock dividers may be included as well. The first level clock dividers 102 and 104 receive a device input clock 90 and divide down the device input clock by a preconfigured factor. The division factor may be the same or different among the first level clock dividers 102, 104. In the example of FIG. 1, the first level clock divider 102 implements a clock division factor of N1 and the first level clock divider 104 implements a clock division factor of N2. The CLK_OUT clock from first level clock divider 102 is a periodic clock signal having a frequency that is 1/N1 of the frequency of the input device clock 90. The CLK_OUT clock from first level clock divider 104 is a periodic clock signal having a frequency that is 1/N2 of the frequency of the input device clock 90.

As their input clocks, the second level clock dividers 106 and 108 receive the CLK_OUT clocks from the corresponding first level dividers 102, 104. That is, the second level clock divider 106 receives the CLK_OUT clock from the first level clock divider 102. Similarly, the second level clock divider 108 receives the CLK_OUT clock from the first level clock divider 104. Each second level clock divider divides down the frequency of its input clock. The division factors of the second level clock dividers 106, 108 are M1 and M2, respectively. M1 may be equal to M2 or different than M2. The CLK_OUT clock from the second level clock divider 106 has a frequency that 1/M1 of the frequency of its input clock, which is the CLK_OUT from first level clock divider 102. As a result, the CLK_OUT clock from the second level clock divider 106 has a frequency that is 1/(N1×M1) of the frequency of the input device clock 90. Similarly, the CLK_OUT clock from the second level clock divider 108 has a frequency that 1/M2 of the frequency of its input clock, which is the CLK_OUT from first level clock divider 104. As a result, the CLK_OUT clock from the second level clock divider 106 has a frequency that is 1/(N2×M2) of the frequency of the input device clock 90.

The electronic device 100 also includes an input flip-flop 120 and a counter 130. The D input of the flip-flop 120 receives the externally generated (i.e., external to the electronic device 100) reference signal 95 and the clock input (CLK) of the flip-flop 120 receives the input device clock 90. In some embodiments, the reference signal 95 may be a SYSREF signal and is referred to in this example as the SYSREF signal 95. The SYSREF pulse period may be the lowest common multiple (LCM) of all the different clock periods used within the device, or an integer multiple of the LCM. The input flip-flop 120 latches the externally generated SYSREF signal 95 using the device clock 90 to produce a latched SYSREF signal. The Q output of the flip-flop 120 which outputs the latched SYSREF signal is coupled to the SYSREF input of the counter 130. The device clock 90 is provided to the clock input of the counter 130. The counter's SYSREF input initializes the counter to begin counting after chip reset. The counter counts pulses of the device clock 90. Once a configurable number (L) of pulses have been detected, the counter outputs a pulse on its clock output terminal (labeled in FIG. 1 as SYSREF_OUT). The counter 130 continues counting the device clock pulse and outputs a SYSREF_OUT output pulse every L pulses of the device clock. Thus, one pulse of the externally-generated SYSREF signal 95 causes the counter to generate a periodic pulse train of pulses at a rate of one pulse for every L pulses of the device clock 90. The output signal generated by the counter 130 is shown in FIG. 1 as the INTERNALLY_GENERATED_SYSREF signal 132. The counter's SYSREF_OUT signal is provided to the SYSREF inputs of the clock dividers 102-108. The clock dividers are thus synchronized through the counter's output signal, not the externally generated SYSREF signal 95.

In some embodiments, the value of L is configured into the counter 130 based on the lowest common multiple (LCM) of all of the clock divider division factors. The example of FIG. 1 includes four division factors—N1, N2, N1×M1, and N2×M2. The value of L should be set to the LCM of all of these division factors, or some integer multiple of the LCM. The value of L for counter 130 may be programmable in some embodiments, such as through a serial peripheral interface (SPI) or other suitable interface.

In some embodiments, multiple pulses of the externally-generated SYSREF signal 95 may be provided. In some embodiments, which of the latched pulses is used by the counter 130 to start counting is programmable. For example, the programming as to which SYSREF pulse to use to start counting can be performed using an SPI or other suitable interface. Based on the programming, the SYSREF pulses provided to the counter 130 may be counted after the device is powered up and then the programmed pulse is selected to trigger the counter. In other embodiments, if the setup/hold is met at the flip-flop 120, then the external SYSREF can be used continuously to trigger the counter. In this latter case, the frequency of the external SYSREF signal 95 needs to match the counter frequency, or match an integer multiple of the counter frequency. If both frequencies are matched and the setup/hold of the flip-flop 120 is met, it will not matter whether the counter 130 is triggered every time or on some particular pulse.

For power savings, heat reduction, or for other reasons, any or all of the various clock dividers 102-108 may be powered down in an idle phase of the electronic device 100. An enable input may be provided for each clock divider to transition the divider to a reduced power mode, or the supply voltage to the clock dividers may be turned off. Upon the clock dividers again being powered on, the clock dividers may again be synchronized using the internally generated SYSREF_OUT signal from the counter 130. No externally-generated SYSREF signal 95 pulses are required once the counter 130 begins counting and generating the INTERNALLY_GENERATED_SYSREF signal 132.

In some embodiments, the SYSREF_OUT terminal of the counter 130 may be gated when the INTERNALLY_GENERATED_SYSREF signal 132 is not needed to synchronize the clock dividers. A control signal (designed in FIG. 1 as "CTL") may be provided to a control input of the counter 130. When the control signal to the counter 130 is asserted (high or low depending on the implementation), an output gate (not shown) on the SYSREF_OUT terminal gates off the INTERNALLY_GENERATED_SYSREF signal 132, thereby precluding the counter 130 from generating additional clock pulses. As a result of gating off the INTERNALLY_GENERATED_SYSREF signal, coupling is reduced or eliminated from the INTERNALLY_GENERATED_SYSREF signal to other signals such as the various clock signal (e.g., device clock 90, the output divided clocks from the clock dividers). The counter 130 can be controlled to again permit SYSREF_OUT pulses to be distributed to the clock tree and then subsequently gated off as desired.

Figure 2:
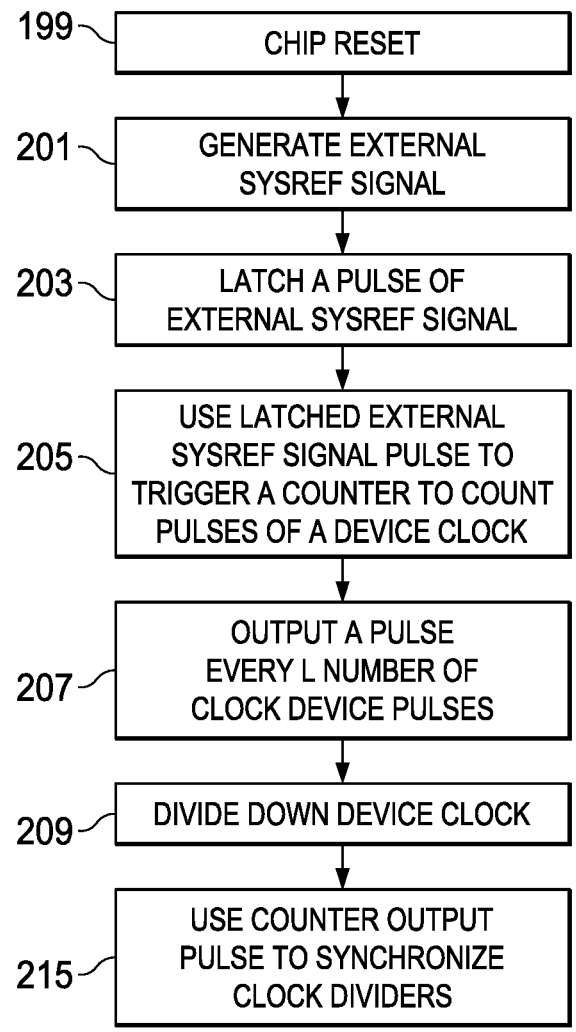
FIG. 2 shows a method in accordance with various examples.

FIG. 2 illustrates a method in accordance with various embodiments. The operations shown in FIG. 2 may be performed in the order shown, or in a different order. At 199, a chip containing the electronic device 100 is reset. Reset may occur, for example, upon a power-on event. Upon the chip reset, one or more external SYSREF signal pulses are generated at 201. The time duration, spacing and number of pulses may be in accordance with the JESD204B specification.

At 203, the method includes latching the SYSREF pulse. The latched external SYSREF signal pulse then may be used to trigger a counter to count pulses of a device clock (205). The device clock may be an externally-generated clock that is provided to the electronic device and, from the device clock, one or more clocks are derived to control the timing of various circuits within the electronic device 100. In some embodiments, the device clock may be provided to a phase-locked loop (PLL) which then generates the clock as a higher frequency clock that then may be divided down to a suitable SYSREF clock.

The counter has been configured to output a pulse for every L number of input clock pulses. At 207, the method thus includes outputting a pulse every L number of clock device pulses as explained above. At 209, the device clock is divided down to produce a first output clock. A clock divider may be used to divide down the device clock. Additional clock dividers may be included to further divide down the first output clock as explained above. The counter's output pulses are then used at 215 to synchronize clock dividers within the electronic device. The counter's output pulses may be transmitted to SYSREF inputs of one or more clock divider circuits.

Figure 3:
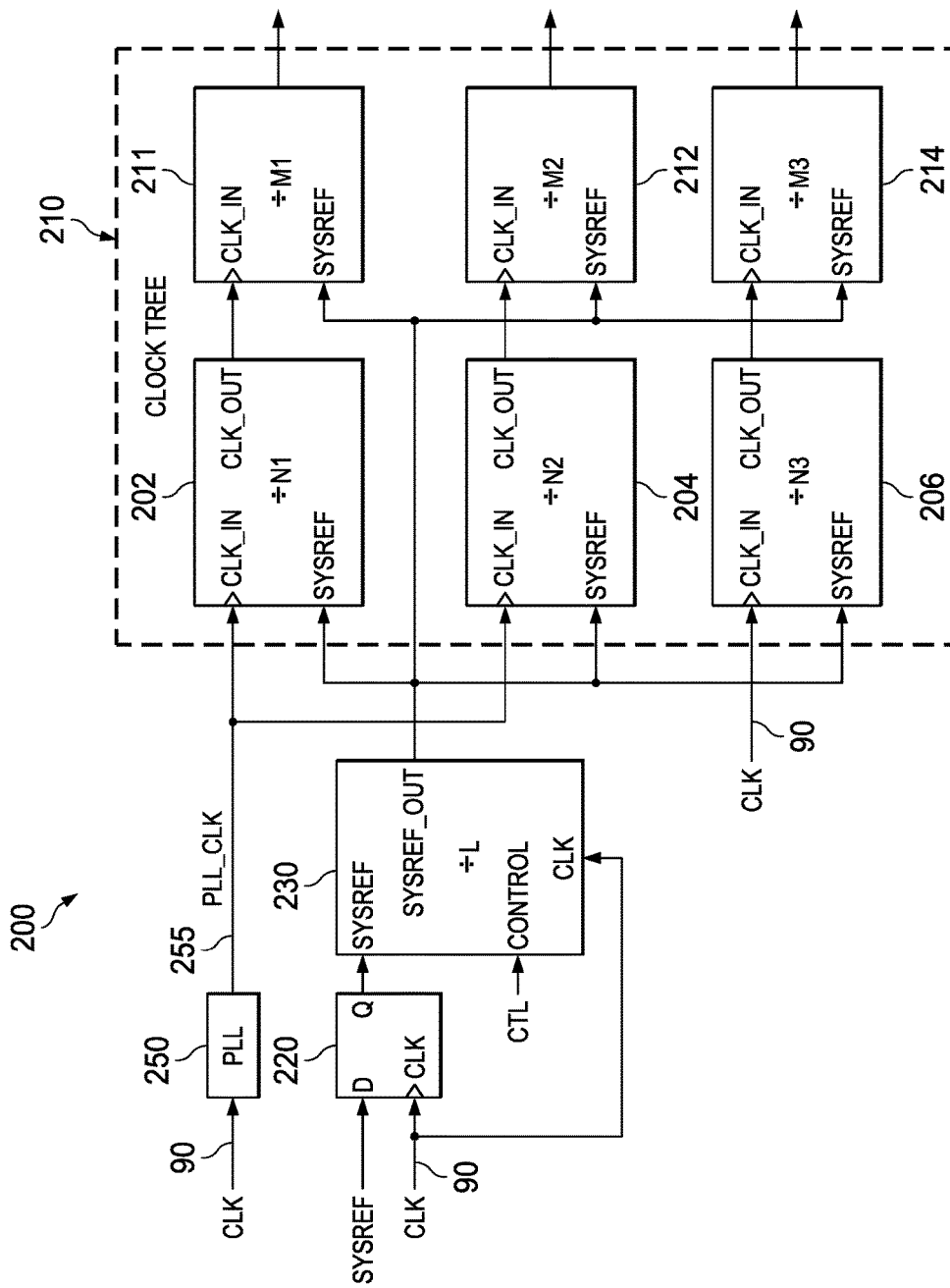
FIG. 3 shows a system in accordance with another embodiment using a phase locked loop.

FIG. 3 shows another embodiment of an electronic device 200 including a clock tree 210. The clock tree 210 in this example includes three first level clock dividers 202, 204, and 206 and three second level clock dividers 211, 212, and 214. The division factors of the first level clock dividers 202-206 are N1, N2, and N3, respectively, and the division factors of the second level clock dividers 211, 212, and 214 are M1, M2, and M3, respectively. The CLK_OUT signals from the first level clock dividers 202-206 are provided to the CLK_IN inputs of the second level clock dividers 211, 212, and 214 as shown. The electronic device 200 of the example of FIG. 3 also includes an input flip-flop 220 and a counter 230, as was the case for example of FIG. 1, and such components function similarly to that as described above.

The embodiment of FIG. 3 includes a phase-locked loop (PLL) 250, which receives the input device clock (CLK) 90. The PLL 250 may be configured to generate an output clock (PLL_CLK) 255 that has a higher frequency than its input clock (CLK). The frequency of the PLL_CLK may be an integer multiple of the device input clock CLK 90. This higher frequency PLL_CLK 255 may be provided to one or more (but not necessarily all) of the various clock dividers of the cascade of dividers. In the example of FIG. 3, PLL_CLK 255 is provided to the input clock terminals of clock dividers 202 and 204. Other clock dividers in the first level of clock dividers may receive the input device clock (CLK) 90 instead of the PLL_CLK 255.

Figure 4:
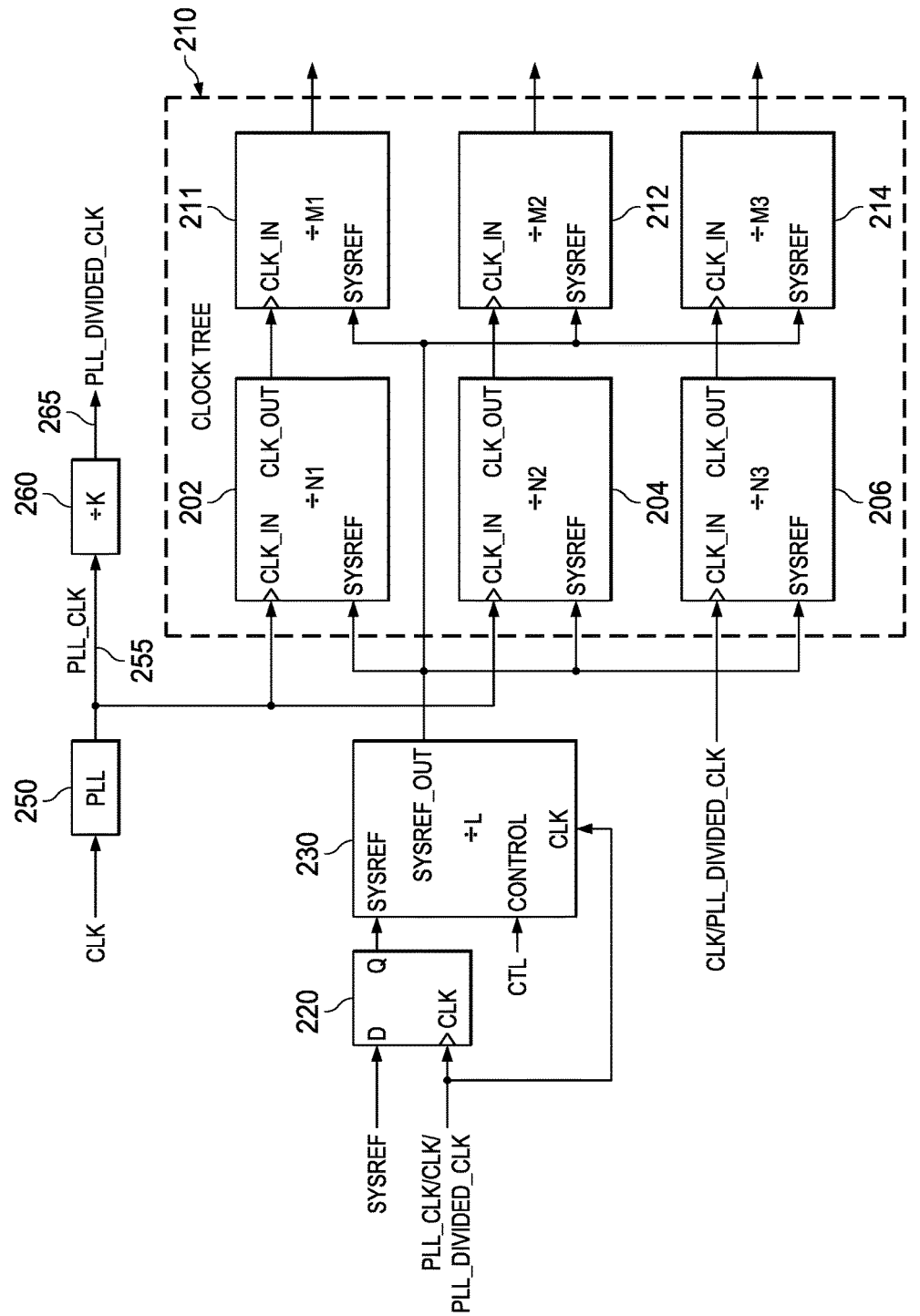
FIG. 4 shows a system in accordance with another embodiment also using a phase locked loop.

The embodiment of FIG. 4 is similar to that of FIG. 3. A difference of the embodiment of FIG. 4 relative to that of FIG. 3 is that a divide-by-K clock divider 260 is included in the embodiment of FIG. 4. Clock divider 260 divides down PLL_CLK by a factor of K.

Some systems may include multiple chips driven from common clock signals. In such systems, the relative phases of the clock signals between the chips may need to be carefully controlled. If the timing between the externally generated SYSREF and the clock signals is not met, then the latched SYSREF may be one input clock period out of sync if the latching clock is the input device clock 90. As a result, the timing of all clocks generated by the respective clock trees may be uncertain by one clock period between the chips. As the period of the PLL_CLK 255 in the embodiments of FIGS. 3 and 4 may be much smaller than the period of the input device clock 90, the uncertainty noted above may be reduced if the external SYSREF signal is latched using PLL_CLK 255. The period of PLL_CLK 255, however, may be so small as to render PLL_CLK 255 unsuitable for latching SYSREF. In this latter case, the PLL_DIVIDED_CLK 265 output of the clock divider 260 instead may be used to latch SYSREF. FIG. 4 illustrates that the flip flop 220 may be clocked with either the PLL_CLK 255, the input device clock 90 (CLK), or the PLL_DIVIDED_CLK 265. Similarly, one or more (but not necessarily all) of the first level clock dividers 202-206 may be clocked with either the PLL_CLK 255, the input device clock 90 (CLK), or the PLL_DIVIDED_CLK 265.

Certain terms may have been used throughout this description and claims to refer to particular system components. This document does not intend to distinguish between components that differ in name but not function. In the description and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
   an input flip-flop including a clock input terminal and a data input terminal configured to be coupled to a first reference signal, wherein the input flip-flop is configured to use first clock to latch the reference signal to produce a latched reference signal;
   a counter coupled to the input flip-flop and configured to count pulses of the first clock starting upon detection of the latched reference signal and to output a second reference signal comprising a pulse for every L pulses of the first clock; and
   a clock tree configured to divide down the first clock to generate a first output clock;
   wherein the clock tree is configured to be synchronized to a pulse of the second reference signal;
   wherein the clock tree includes:
   a first level clock divider coupled to the first clock and configured to divide down the first clock to generate the first output clock;
   a second level clock divider coupled to the first level clock divider and configured to divide down the first output clock to generate a second output clock;
   wherein each of the first and second level clock dividers includes a reference signal input configured to receive the second reference signal pulses from the counter, wherein the second reference signal pulses synchronize the first and second level clock dividers.

2. The system of claim 1, wherein the first level clock divider divides the first clock by a factor M and wherein the second level clock divider divides the first divided clock by a factor N, and wherein L is equal to M×N.

3. The system of claim 2, wherein the counter is programmable for the value of L.

* * * * *